US011708951B2

(12) United States Patent
Bailey

(10) Patent No.: US 11,708,951 B2
(45) Date of Patent: *Jul. 25, 2023

(54) BEAM SHAPING SPECTRALLY FILTERING OPTICS AND LIGHTING DEVICES USING HIGH-INTENSITY NARROW-SPECTRUM LIGHT OUTPUT

(71) Applicant: HLI SOLUTIONS, INC., Greenville, SC (US)

(72) Inventor: Christopher Lane Bailey, Greenville, SC (US)

(73) Assignee: HLI SOLUTIONS, INC., Greenville, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,919

(22) Filed: Jan. 25, 2022

(65) Prior Publication Data

US 2022/0146067 A1  May 12, 2022

Related U.S. Application Data

(63) Continuation of application No. 17/132,300, filed on Dec. 23, 2020, now Pat. No. 11,236,874, which is a
(Continued)

(51) Int. Cl.
| | |
|---|---|
| *F21S 8/08* | (2006.01) |
| *F21K 9/65* | (2016.01) |
| *H01L 33/50* | (2010.01) |
| *H01L 33/58* | (2010.01) |
| *F21V 5/04* | (2006.01) |
| *G02B 6/00* | (2006.01) |

(Continued)

(52) U.S. Cl.
CPC ............ *F21S 8/086* (2013.01); *F21K 9/65* (2016.08); *F21V 5/04* (2013.01); *F21V 7/0091* (2013.01); *F21V 9/00* (2013.01); *F21V 23/04* (2013.01); *G02B 6/00* (2013.01); *H01L 33/504* (2013.01); *H01L 33/58* (2013.01); *H05B 45/37* (2020.01); *F21W 2131/103* (2013.01); *F21Y 2113/13* (2016.08); *F21Y 2115/10* (2016.08)

(58) Field of Classification Search
CPC . F21S 8/086; F21K 9/65; H05B 45/37; F21V 5/04; F21V 7/0091; F21V 9/00; F21V 23/04; G02B 6/00; H01L 33/504; H01L 33/58; F21Y 2113/13; F21Y 2115/10; F21W 2131/103
See application file for complete search history.

(56) References Cited

U.S. PATENT DOCUMENTS 10,876,691 B2 *  12/2020  Bailey .................... F21S 8/086
11,236,874 B2 *   2/2022  Bailey .................... F21V 7/0091
(Continued)

*Primary Examiner* — Bao Q Truong
(74) *Attorney, Agent, or Firm* — Buckley, Maschoff & Talwalkar LLC

(57) ABSTRACT

A lighting device includes a light source emitting light having a first bandwidth. A single optic device is coupled to the light source. The single optic device filters light having a preselected subrange of wavelengths within the first bandwidth to generate a first filtered light. The single optic device controls a shape of a beam of the filtered light. The filtered light creates a high-intensity narrow-spectrum light output. A second light source emits a high-intensity narrow-spectrum light output.

20 Claims, 12 Drawing Sheets

Related U.S. Application Data continuation of application No. 16/173,743, filed on Oct. 29, 2018, now Pat. No. 10,876,691.

(60) Provisional application No. 62/578,714, filed on Oct. 30, 2017.

(51) Int. Cl.
| | |
|---|---|
| *F21V 23/04* | (2006.01) |
| *F21V 7/00* | (2006.01) |
| *F21V 9/00* | (2018.01) |
| *H05B 45/37* | (2020.01) |
| *F21Y 113/13* | (2016.01) |
| *F21Y 115/10* | (2016.01) |
| *F21W 131/103* | (2006.01) |

(56) References Cited

U.S. PATENT DOCUMENTS

| | | | |
|---|---|---|---|
| 2015/0071819 A1* | 3/2015 | Todeschini | A61L 2/0047 250/455.11 |
| 2015/0252979 A1* | 9/2015 | Bailey | F21V 5/04 359/885 |
| 2017/0246331 A1* | 8/2017 | Lloyd | A61L 2/084 |

* cited by examiner

| PRESET | POWER (WATTS) | CCT | ILLUMINANCE | CRI | ILLUSTRATION REFERENCE | ENVIRONMENTAL ZONE | | XXX |
|---|---|---|---|---|---|---|---|---|
| 1 | 116 | 3613 | 1399 | 70 | | ZONE 1 | CITY CENTERS, MIXED USE DEVELOPMENT | 1.4 |
| 2 | 112 | 3588 | 1236 | 67 | | | | 1.4 |
| 3 | 100 | 3641 | 1556 | 70 | | | | 1.4 |
| 4 | 94 | 3749 | 2219 | 72 | | | | 1.4 |
| 5 | 88 | 3737 | 2101 | 72 | | | | 1.4 |
| 6 | 80 | 3760 | 2336 | 72 | | ZONE 2 | LOW POPULATION DENSITY | 1.3 |
| 7 | 74 | 3582 | 1085 | 48 | | | | 1.3 |
| 8 | 67 | 3791 | 2539 | 73 | | | | 1.3 |
| 9 | 61 | 3579 | 1166 | 63 | | | | 1.3 |
| 10 | 54 | 3794 | 2603 | 73 | | | | 1.3 |
| 11 | 48 | 3717 | 1977 | 71 | | ZONE 3 | NATIONAL PARKS AND PROTECTED ENVIRONMENTS | 1.2 |
| 12 | 41 | 3677 | 1709 | 70 | | | | 1.2 |

FIG. 12

BEAM SHAPING SPECTRALLY FILTERING OPTICS AND LIGHTING DEVICES USING HIGH-INTENSITY NARROW-SPECTRUM LIGHT OUTPUT

CROSS-REFERENCE TO RELATED APPLICATION

This application is a continuation of U.S. application Ser. No. 17/132,300, filed Dec. 23, 2020, which is a continuation of U.S. application Ser. No. 16/173,743, filed Oct. 29, 2018, which claims the benefit of priority from provisional Application No. 62/578,714, filed Oct. 30, 2017, the entire contents of which is incorporated herein by reference for all that is taught.

BACKGROUND

Field of the Disclosure

The present disclosure relates generally to lighting devices. More particularly, embodiments of the present disclosure are directed to methods and devices used in connection with the lighting device that alter the photometric distribution of a light-emitting diode (LED), including laser-diodes and quantum LEDs (QLEDS), while simultaneously altering the spectral power distribution (SPD) of the emitted light. Further embodiments include a lighting device that uses both filtering optics and non-filtering optics in a controlled manner to provide a desired lighting environment.

Description of Related Art

One known device, depicted in FIG. 1, includes a typical packaged LED light source, which is comprised of a blue light LED chip 12 that emits light 11 with an emission peak in the blue wavelength range. The blue light LED chip is protected by a resin mold 13 which encapsulates a phosphor material 14 that is excited by the blue light 11 emitted from the blue light LED chip. The encapsulated phosphors 14 absorb some of the blue light 11 from the LED and emit green and red light 15, as determined by the phosphor chemistry, which is combined with the non-absorbed blue light 11 emitted from the blue light LED chip. This results in white light 16 being emitted with an emission peak in the blue wavelength range.

An independent optical filter 17 is then placed in the path of the emitted white light 16, which has a blue emission peak, in an attempt to filter some of the blue light. This results in filtered white light 18, which is claimed to have a "warmer" CCT than unfiltered white light 16. Such warmer white light is necessary for residential or hospitality indoor applications. However, illumination devices that use secondary filter media in an attempt to control the spectral components of the emitted light, such as the one depicted in FIG. 1, are problematic for commercial applications, specifically those applications where a greater level of photometric control is required. Such proposed solutions result in increased optical losses, which leads to lower system efficacy and can potentially cause a shift in the photometric pattern of the emitted light because the light is transmitted through a second surface whose geometry and or refractive index can prevent light from transmitting through it without alterations and losses.

SUMMARY

According to an exemplary embodiment, a lighting device includes a light source emitting light having a first bandwidth. A single optic device is coupled to the light source. The single optic device filters light having a preselected subrange of wavelengths within the first bandwidth to generate a first filtered light. The single optic device controls a shape of a beam of the filtered light. The filtered light creates a high-intensity narrow-spectrum light output. A second light source emits a high-intensity narrow-spectrum light output.

According to another exemplary embodiment, a method of making a lighting device includes mixing a filtering agent with an optical material, shaping the result of the mixing to form a filtering optic device, and coupling the filtering optic device to at least one LED that emits light waves in a first range of wavelengths. The filtering agent filters light having a preselected subrange of wavelengths within the first range of wavelengths to generate a first filtered light. The filtering optic device controls a shape of a beam of the filtered light. The filtered light creates a high-intensity narrow-spectrum light output. The filtered light is combined with a high-intensity narrow-spectrum light output.

According to another exemplary embodiment, a lighting device includes a first light source emitting light having a first bandwidth, and a second light source emitting light having a high-intensity narrow-spectrum light output. A first optic device is coupled to the first light source. The first optic device filters light having a preselected subrange of wavelengths within the first bandwidth and generates a first filtered light. A second optic device is coupled to the second light source. The second optic device permits the second bandwidth of light to pass through it unfiltered. A control device is operably connected to the first and second light sources and operable to control whether light is emitted from one, both or neither of the first and second light sources.

BRIEF DESCRIPTION OF THE DRAWINGS

Exemplary embodiments of the disclosed device and method are described in detail below by way of example, with reference to the accompanying drawings, in which:

FIG. 12 is a table showing a list of twelve different preset values and their corresponding lighting parameter values for controlling the LEDs corresponding to the filtered and non-filtered optics in the luminaire of FIG. 10;

DETAILED DESCRIPTION

Figure 1:
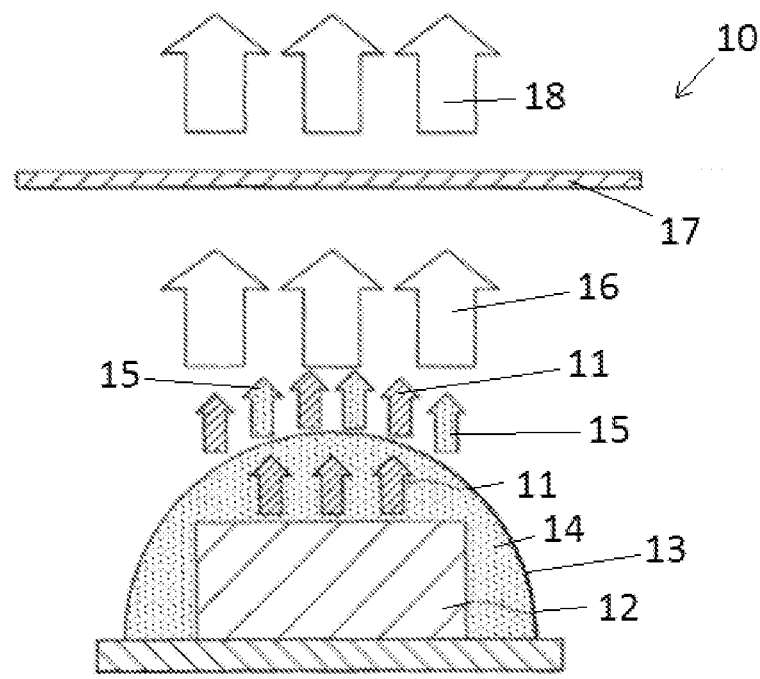
FIG. 1 illustrates a known method of filtering blue light in accordance with a conventional LED lighting device.
Figure 2A:
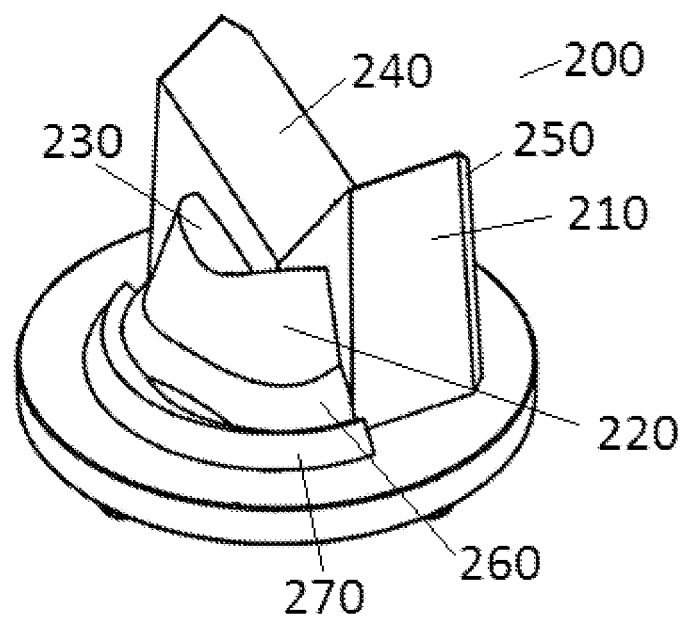
FIG. 2A is a perspective view of a TIR optic for an LED lighting device consistent with an exemplary embodiment of the present disclosure.
Figure 2B:
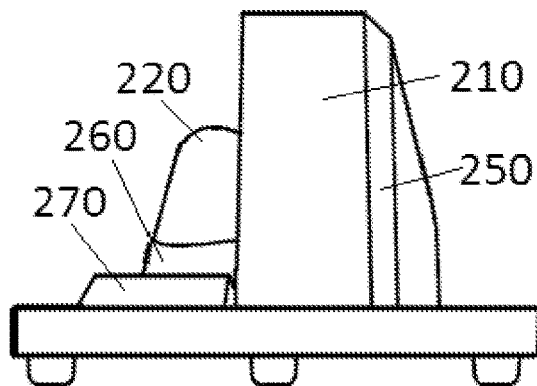
FIG. 2B is a side elevation view of the optic shown in FIG. 2A.
Figure 2C:
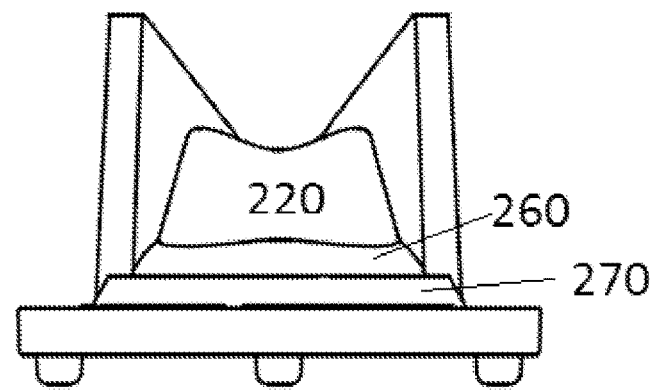
FIG. 2C is a front elevation view of the optic shown in FIG. 2A.

Various exemplary embodiments relate to an LED device having a single beam-shaping optic coupled thereto. The coupled optic, such as a free-form total internal reflection (TIR) optic, transforms the photometric distribution of the light emitted from the LED to the desired pattern and also provides band-pass filtering to control the spectral power distribution of the light emitted from the LED. FIGS. 2A-2C illustrate one type of LED optic that can be used in connection with embodiments of the present application. One or more of the LED optical devices consistent with the present application can be utilized within a luminaire assembly to illuminate a desired target area with the desired wavelengths of light.

One or more embodiment includes a beam-shaping TIR optic of engineered resin material, referred to herein simply as resin but including other suitable materials such as glass and silicone. The optic is formed by mixing a filtering agent with a material suitable for an optic, such as acrylic (poly (methyl methacrylate), or simply PMMA)), plastic, silicone, glass, polymer, resin and others. The optic is optically coupled with an LED to transform the photometric distribution of the emitted light to a desired pattern, and can also be capable of providing some level of band-pass filtering at the same time. As a result, the overall spectral power distribution of the luminaire is controlled. While the basic use of TIR optics is known, utilizing a resin that filters and/or performs a Stokes shift on the light by use of a particular material within a TIR optic, such as a dye, phosphors, fluorescing materials and quantum dots, is not. As discussed above, current methods involve filtering the emitted light using a secondary filter media, which causes increased optical losses and potentially shifts the photometric pattern due to the specific geometry and/or refractive index of the lens.

Light filtering and beam shaping by a single optic in accordance with various embodiments consistent with the disclosure can be used in a variety of applications including, but not limited to, general interior lighting; general exterior lighting; flood-lighting, including lighting for food processing and display; portable lighting; automotive lighting; mobile equipment lighting; art illumination; retail and general display lighting; aircraft and aerospace lighting; lighting for light-sensitive biological and pharmaceutical processes, semiconductor processing and other light sensitive applications; and lighting for medical applications, such as sterilization lighting devices to reduce or inactivate bacteria.

Filtering specific wavelengths of light to emit a controlled spectral density and influencing the spectrum in accordance with present application can be used, for example, to limit or prevent specific frequencies of visible or non-visible light from being projected into an environment, for preferential reasons or in an effort to prevent adverse or undesirable environmental, physiological and/or technical consequences. Improvement of color quality in various lighting applications is another result of carrying out techniques disclosed herein, such as, in regard to the hospitality and retail lighting space.

In addition to providing a lighting solution that includes spectrally filtering optics further aspects of a lighting device disclosed herein include both filtered and non-filtered optics. According to exemplary embodiments light modules that include one or more filtered optics are provided in a single luminaire along with light modules that have non-filtering optics. Depending on the light output desired, for example, wavelength, color temperature and other spectral components, the light modules are activated in a controlled manner to achieve the desired effect.

In accordance with further exemplary embodiments a dynamic system is provided. The dynamic system consists of LED arrays configured with a combination of filtering optics and standard clear, non-filtering, optics, e.g., made of PMMA. According to further exemplary embodiments the dynamic system is combined with a controller, such as either a wireless or wireline controller, that controls which LED, or combinations of LEDs, is activated. According to these exemplary embodiments any combination of filtered and non-filtered optics within a single lighting device, e.g., luminaire, can be achieved.

According to one or more exemplary embodiments, a self-contained intelligent wireless control module, or PCB integrated design, is provided which contains one or more independently controlled switching outputs and one or more digital and/or analog 0-10V outputs, which can be used to switch power and make operating current adjustments to connected LED power supplies and provide full-range dimming.

Each intelligent wireless, or wireline, control module is capable of controlling one or more fixtures and can be individually controlled or grouped with other lighting devices. The wireless control module communicates, for example, via 900 MHz radio frequency to other devices within a wireless self-organizing and self-healing mesh network.

Both wireless and non-wireless standalone controller and integrated designs utilize non-volatile memory where time-based adaption or control can be programed, stored and autonomously activated.

According to one aspect of the invention a lighting device is provided that includes a light source emitting light having a first bandwidth, and a single optic device coupled to the light source, wherein the single optic device filters light having a preselected subrange of wavelengths within the first bandwidth to generate a first filtered light and controls a shape of a beam of the filtered light.

According to another aspect of the invention a lighting device is provided that includes a first light source emitting light having a first bandwidth, a second light source emitting light having a second bandwidth, a first optic device coupled to the first light source, wherein the first optic device filters light having a preselected subrange of wavelengths within the first bandwidth and generates a first filtered light. The luminaire further includes a second optic device coupled to the second light source, wherein the second optic device permits the second bandwidth of light to pass through it unfiltered. A control device is further provided that is operably connected to the first and second light sources and is operable to control whether light is emitted from one, both or neither of the first and second light sources.

According to yet another aspect of the invention, a method of making a lighting device is provided that includes mixing a filtering agent with an optical material, shaping the result of the mixing operation to form a filtering optic device and coupling the filtering optic device to at least one LED that emits light waves in a first range of wavelengths. According to this aspect the filtering agent absorbs light waves having a wavelength within a subrange of the first range of wavelengths and the filtering optic device controls a beam shape of the lighting device.

Exemplary embodiments of devices consistent with the present disclosure include one or more of the novel features described in detail below. For example, one or more of the exemplary embodiments disclosed include a TIR optic coupled to an LED device, the optic being formed with one or more materials for absorbing a band of visible light waves and shifting the wavelength of at least a portion of the absorbed light bandwidth to one or more wavelengths outside the absorbed bandwidth.

Figure 2D:
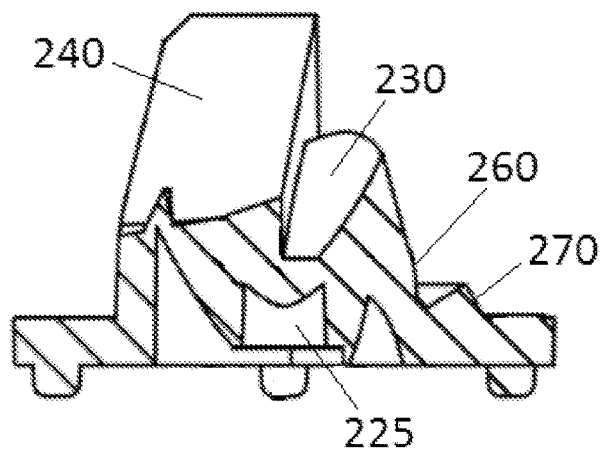
FIG. 2D is a sectional view of the optic shown in FIG. 2A.

FIG. 2A is a perspective view of a TIR optical lens 200, or optic, for an LED lighting device in accordance with an exemplary embodiment. FIGS. 2B and 2C are side and front elevation views, respectively, of optic 200. Optic 200 is a free-form optic made of acrylic, or some other appropriate material, such as plastic, silicone, glass, polymer, resin and others. According to the embodiment shown, free-form optic 200 includes one or more reflective or refractive surfaces 210, 220, 230, 240, 250, 260, 270, the shapes of which are uniquely designed to control and shape the emitted light to a desired pattern. FIG. 2D is a cut-away, or sectional, view of optic 200 cut along the center line. The external refractive surfaces are shown in FIG. 2D as well as internal cavity 225, which houses an LED chip (not shown).

Figure 3:
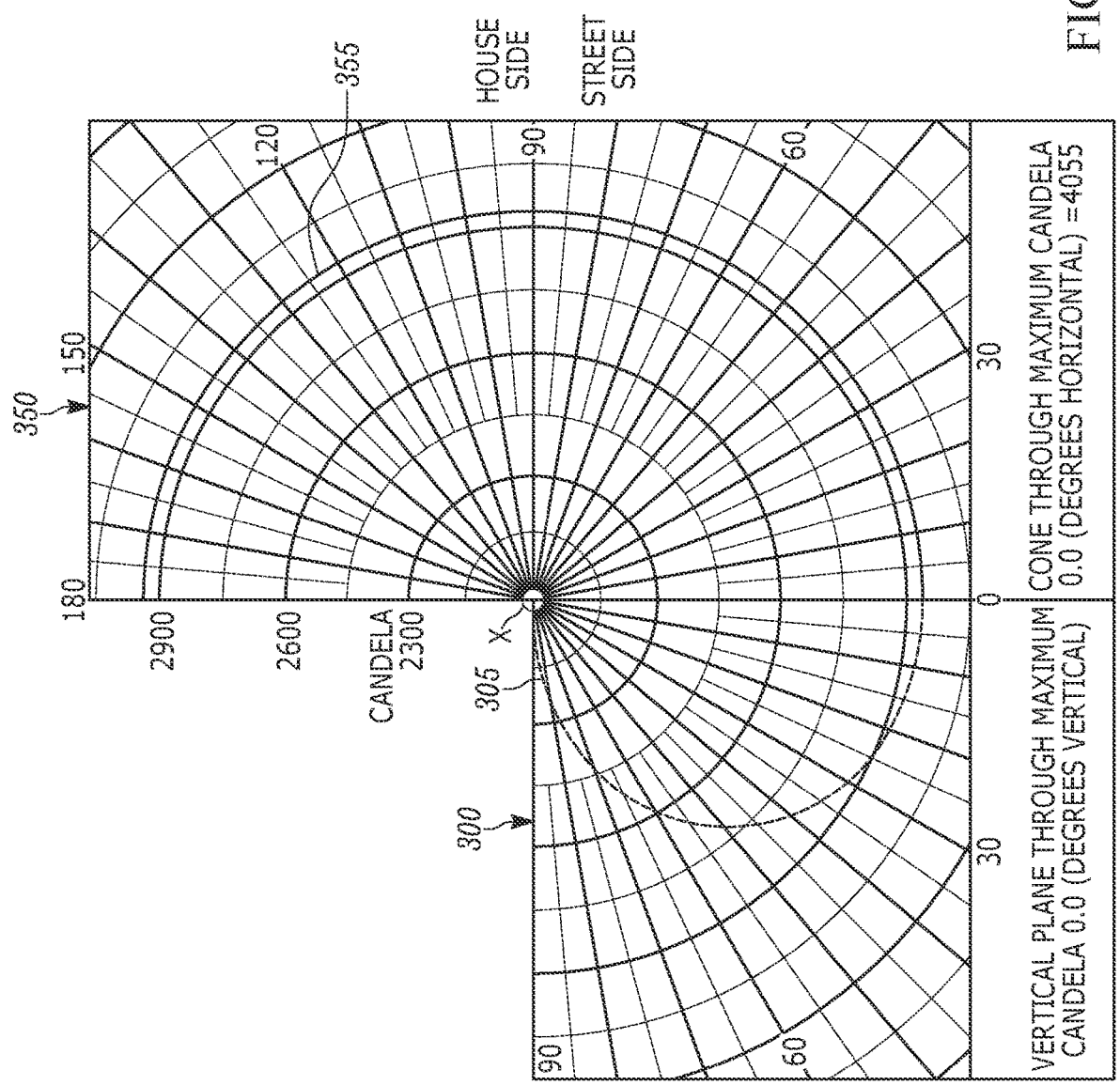
FIG. 3 is a candela plot of a bare LED without a coupled optic.

FIG. 3 is a candela plot of a bare board LED in accordance with the present application. More particularly, as illustrated by the dashed line 305 on plot 300 on the left-hand side of FIG. 3, a bare LED (not shown), that is, and LED without a beam shaping TIR optic coupled to it, provides light intensity that is a maximum, about 4,055 candelas in the example shown in FIG. 3, at a point directly below the LED, i.e., 0 degrees vertical angle. The light intensity steadily decreases as the vertical angle increases to about 0.0 candelas at a vertical angle of 90 degrees and remains at 0.0 candelas at vertical angles greater than 90 degrees, i.e., above the plane of the LED.

By way of example and by no means limiting, the right-hand side 350 of FIG. 3 is a candela plot that shows the relative intensity of light for the bare LED as measured from a horizontal plane. As shown by the semi-circular plot 355, a bare LED positioned to illuminate in a vertical direction and without any optic coupled to it provides an even maximum intensity at all horizontal angles. For example, the LED in FIG. 3 is positioned at the spot labeled "X", and at a given height, e.g., 20 feet, above the horizontal plane, e.g., the ground. Plot 355 shows that the maximum intensity, i.e., approximately 4,055 candelas, is illuminated in a consistent circular pattern. That is, the same maximum luminous intensity value, i.e., 4055 candelas, is measured at each lateral angle.

Figure 4:
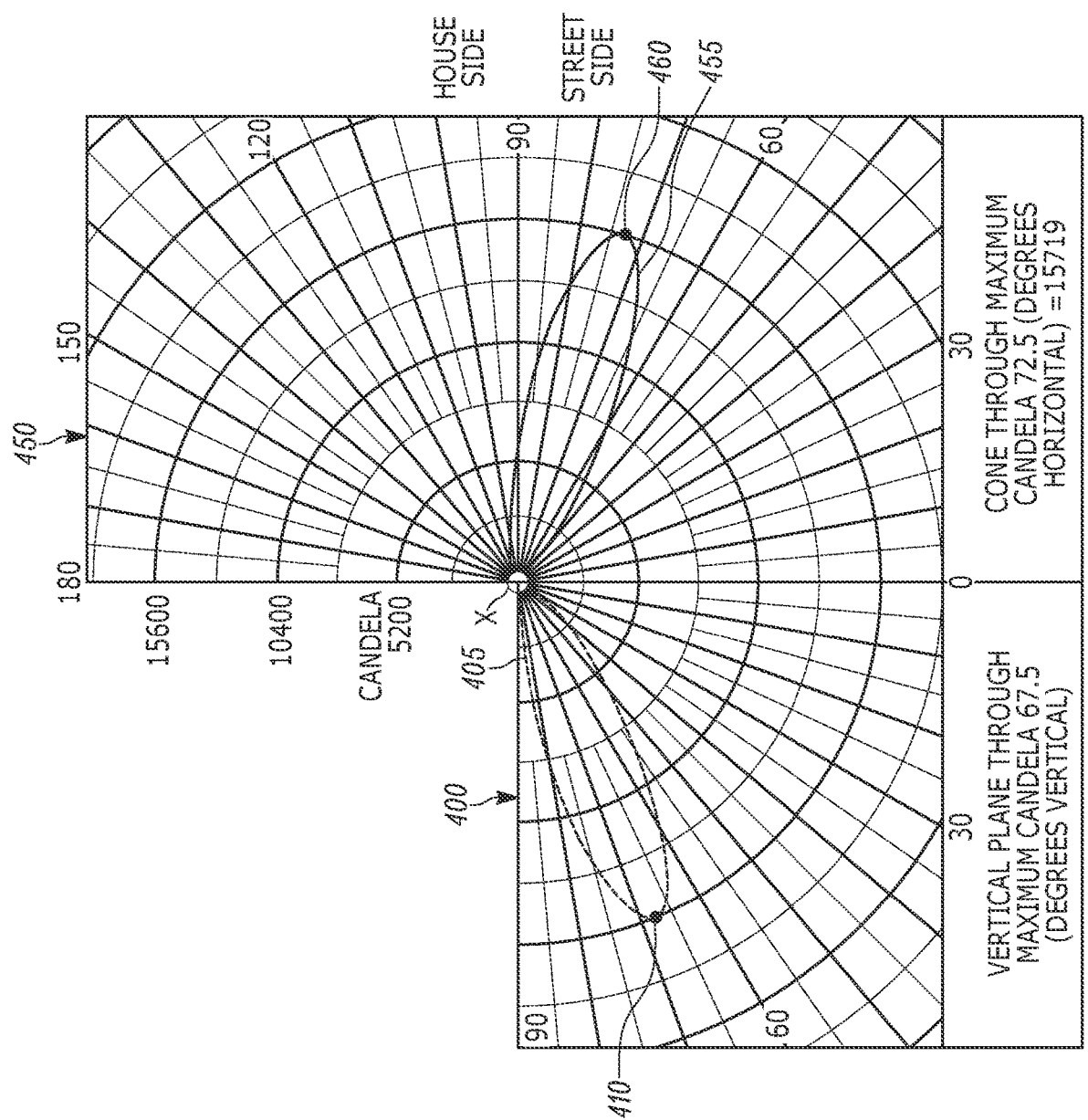
FIG. 4 is a candela plot of an LED with the optic shown in FIGS. 2A-2D coupled to it.

FIG. 4 is a candela plot similar to the plot shown in FIG. 3, but with one major difference. Instead of measuring the bare LED, as in FIG. 3, FIG. 4 is the candela plot when the TIR optic shown in FIGS. 2A-2D is coupled to the LED. The left-hand side 400 of FIG. 4 includes dotted line plot 405 which has a much more narrow distribution than the corresponding plot in FIG. 3 for the bare LED. Specifically, as shown, the maximum luminous intensity of the LED with optic is shown to be approximately 15,719 candelas and this maximum intensity occurs at a vertical angle of approximately 67.5 degrees, i.e., at the point labeled 410.

The right-hand side, 450, of FIG. 4 shows the luminous intensity distribution through a plane that includes the maximum candela value, i.e., approximately 15,719 candelas. As shown, an elongated distribution is achieved along the maximum intensity plane at a lateral angle of about 72.5 degrees, i.e., at point 460.

Thus, as shown in FIGS. 3 and 4, in accordance with one aspect of the present application, by coupling a specifically designed optic, such as the one shown in FIG. 2A-2D, to an LED, it is possible to shape the light from the LED to a desired pattern. The light pattern shown in FIG. 4, for example, would be useful for illuminating an object or objects in an open area, such as in a parking lot or a street.

Shaping the light beam such that the light intensity is directed in the precise directions desired for a particular purpose is only one aspect of the present application. Controlling the spectral content of the emitted light is another aspect. In accordance with one exemplary embodiment the spectral content of the emitted light is controlled such that the amount of blue light emitted from the luminaire is vastly reduced or eliminated.

Figure 5:
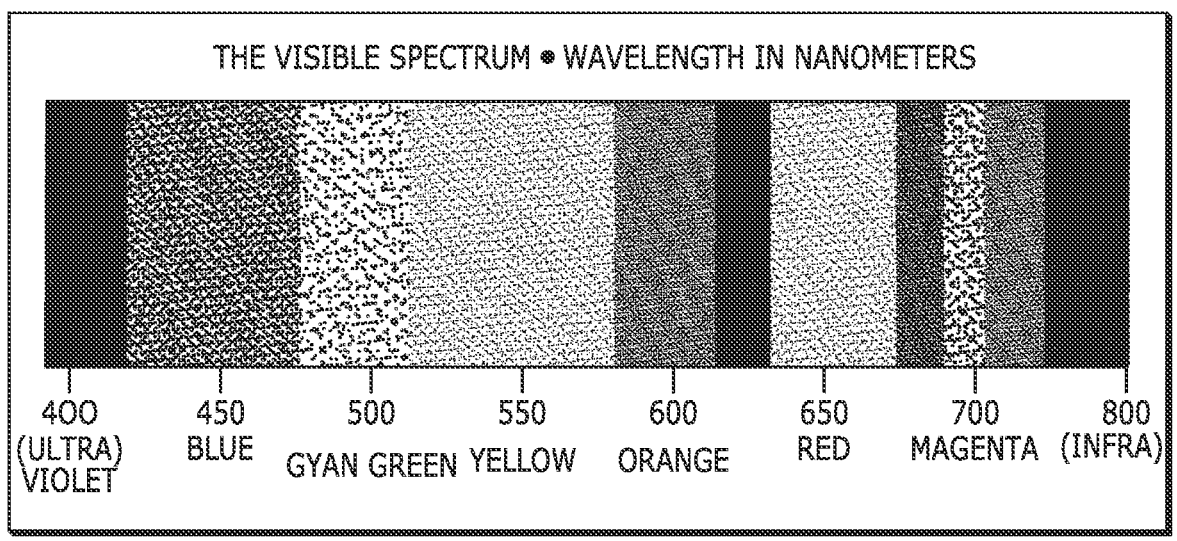
FIG. 5 is a spectral chart showing the respective wavelengths for radiation in the visible and near visible spectrum.

FIG. 5 is a spectral chart showing the respective wavelengths for radiation in the visible and near visible spectrum. The human eye recognizes, or "sees," light in the visible spectrum, which includes light waves with wavelengths ranging from about 380 nm to about 780 nm. The portion of the spectrum with wavelengths below 380 nm is known as near-ultra-violet to ultra-violet radiation and wavelengths above 740 nm are known as infra-red radiation. Moreover, within the overall range of visible light, each wavelength represents a different color, as seen by the human eye. For example, blue light has a wavelength that ranges from about 435 nm to about 500 nm, and green light is in the range from about 520 nm to about 565 nm.

Figure 6:
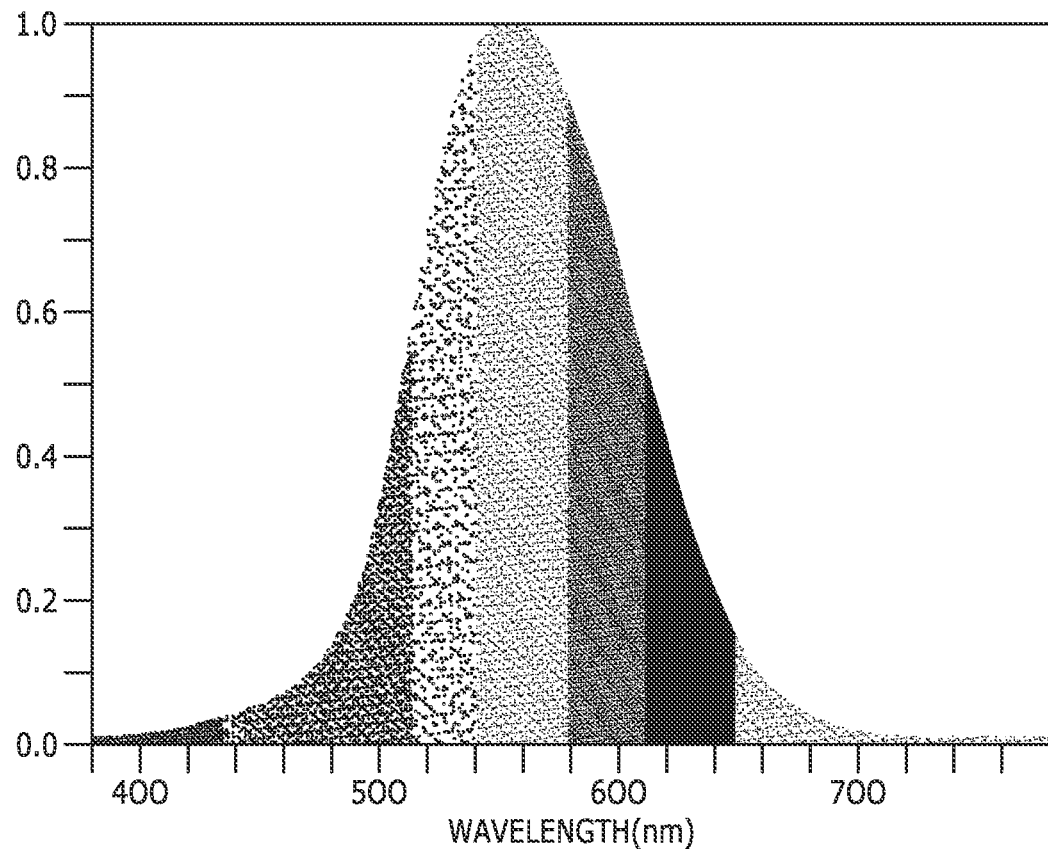
FIG. 6 is a chromaticity diagram illustrating the relative intensities of different color light waves as observed by the human eye during typical daylight conditions.

FIG. 6 illustrates the luminosity function or luminous efficiency function which describes the average spectral sensitivity of human visual perception of brightness. It is based on subjective judgments of which of a pair of different-colored lights is brighter, to describe relative sensitivity to light of different wavelengths. It should not be considered perfectly accurate in every case, but it is a very good representation of visual sensitivity of the human eye and it is valuable as a baseline for experimental purposes. These are referred to as "photopic" conditions. Thus, as illustrated, during photopic conditions the human eye is most sensitive to green light, that is, light with a wavelength of approximately 555 nm. As shown in the figure, yellow and cyan are the next most recognizable colors, e.g., from an intensity standpoint, followed by blue and orange and then violet and red.

Figure 7:
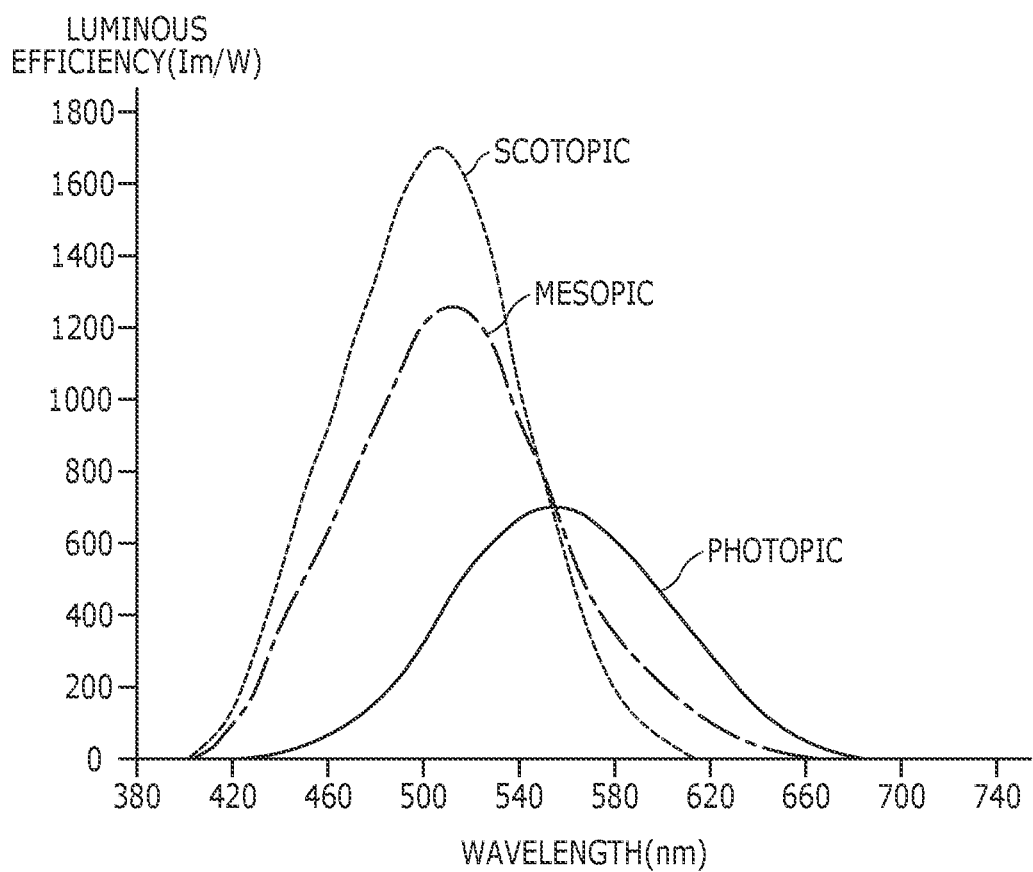
FIG. 7 is a chart showing the different luminous efficacies of different color light waves under photopic, mesopic and scotopic conditions.

FIG. 7 shows the relative difference in the way in which the human eye responds to light of different frequencies, or wavelengths, i.e., luminous efficacy, during daylight (photopic), twilight (mesopic) and extremely low-light (scotopic) conditions, respectively. As shown, when the viewing environment is dark, such as, during night time hours when no moon is shining, the luminous efficacy curve shifts downward, i.e., to the left in FIG. 7, as compared to the photopic response. Under these conditions the human eye is most sensitive to blue light, e.g., light having a wavelength of about 507 nm or so.

Accordingly, when lighting having a significant amount of blue light, such as the white light LEDs discussed above, is used to illuminate targets outdoors at night, light in the blue wavelength range that is scattered into the environment, e.g. Rayleigh scattering, will have the most impact on the night sky. In other words, humans will recognize the scattered blue light portion of any scattered white light more than colors of other wavelengths. Thus, street lights and flood lights that use bright white LEDs contribute a significant amount of blue light into the sky when the light is either reflected off an object or when the light beam is not sufficiently controlled and some of the light is directly emitted into the sky. Such conditions are a significant cause of light pollution as discussed above.

In accordance with an exemplary embodiment of the application, targeted blue light wavelengths are absorbed by the physical components of a TIR optic, such as the one depicted in FIGS. 2A-2D, and the emitted spectral content is shifted. For example, a dye that is able to absorb light in blue wavelength range is mixed with an acrylic material used to make the optic. As a result, a band of wavelengths comprising blue light, from the overall white light spectrum outputted from a white light LED, is absorbed by the dye, while light of other wavelengths outside the absorbed band are permitted to pass through the optic. Any scattered light from, for example, a street light employing one or more LED devices in accordance with the present embodiment, that would otherwise contribute to light pollution as discussed above would not be emitted into the night sky.

According to a further exemplary embodiment, filtered optics in accordance with the invention are used to filter harmful light wavelengths before light of these wavelengths are permitted to come into contact and/or be absorbed by various food products. According to these and other embodiments, specific wavelengths of light, e.g., blue light in the 400-500 nanometer range, is filtered from the emitted light of one or more LEDs. Such LEDs provide illumination of the food or beverage, such as meat, cheese, milk, and other dairy products, as well as soft drinks, fruit juices and even beer, just to name a few.

The method by which the specific light waves are filtered from the emitted light include a filtering optic at the light source, such as one or more of the optics described above and illustrated in the drawings. Another method for filtering the appropriate wavelengths of light prior to it being absorbed by solid or liquid food, includes providing packaging for the food that filters the appropriate wavelengths. For example, a bottle for packaging milk, beer or some other beverage that is readily affected by light waves, is produced having a light filtering property.

The present embodiment would be appealing, for example, to owners/operators of milk/dairy farms and processing facilities which, like others, are very interested, compelled even, to reduce the energy consumption at their facilities as a means to offset electrical lighting and related HVAC costs.

Unfortunately, as mentioned above, milk is susceptible to "light activated" flavors and nutrient reduction, specifically to wavelengths of light below 500 nm, which some producers have attempted to somewhat mitigate through the use of colored packaging (e.g., yellow and/or UV coated). The costs associated with opaque and light-blocking packaging, however, are difficult to recover from the consumer. Additionally, the production, processing, refrigeration and related transportation facilities utilize light sources, such as inefficient Metal Halide & Fluorescent lights, which are targets for more energy-efficient LED lighting technology. While these legacy sources produce UV which has also been shown to affect the quality of the food product, they produce substantially much less blue light in the 400-500 nm range, in comparison to LEDs.

LED light sources were not available when the bulk of the research was conducted for the development of the packing and coating systems used on dairy products. In view of the advancement to LED illumination, therefore, a resin consistent with embodiments disclosed herein offer a suitable improvement over current packaging. Specifically, the current resin used by the dairy and other beverage industries in their bottling processes do not filter or up-shift unwanted wavelengths of light, such as damaging blue light. Resins and other materials made in accordance with embodiments disclosed herein, however, perform such filtering and shifting, as described above.

Thus, as the grocery industry shifts towards the use of LED refrigeration case lighting, that is, lighting that contains more blue content than traditional light sources, dairy products packaged in white and/or clear packing will experience far greater spoilage rates. To reduce or eliminate such increased spoilage, filtering optics at the light source and/or packaging made from a resin or other material that absorbs and/or shifts the blue light wavelengths in accordance with one or more embodiments of the invention will overcome the problem.

Other exemplary embodiments of the present invention that utilize the filtered optics include, but are not limited to, (1) general ambient or task illumination used in food production, processing, refrigerated storage and related transportation (e.g., source to shelf), (2) refrigeration lights used in consumer and professional appliances, (3) refrigeration lights used in professional retail case appliances, (4) interior cargo lights used by dairy, meat, and agricultural transportation industry, and (5) industrial/commercial luminaires utilized in related production/processing/refrigeration/transportation of dairy/meat/produce (i.e., food). Moreover, potential new uses for filtered optics materials that are unrelated to illumination include, (1) product packaging and (2) display case windows.

Beer, for example, is typically bottled and packaged in areas illuminated with High Pressure Sodium (HPS) lights. This is because HPS lights do not emit a significant amount of light having wavelengths in the critical range of around 350-500 nm. If during the bottling process, and through to the case packing operation where the bottles are no longer exposed to the light, the bottles are exposed to light for an inordinate amount of time, such as when a machine breaks down, etc., the content of all of the exposed bottles must be disposed of.

An exemplary LED that can be used in accordance with one or more embodiments is a bright white light LED such as the Nichia 219B LED by Nichia Corporation. As mentioned above, such white light LEDs tend to emit a significant amount of blue light which ideally should be filtered or Stokes-shifted, to provide a more acceptable spectral content. In accordance with an exemplary embodiment of the disclosure, a dye for absorbing blue light is mixed into the plastic or acrylic material used to form the TIR optic.

One known dye that can be incorporated into the plastic optic in accordance with various embodiments is DYE 500 nmLP by Adam Gates & Company, LLC of Hillsborough, N.J. This particular dye is a yellow free flowing powder material that can be melted and mixed evenly with the plastic or acrylic material used for forming the main optic structure. One suitable material is an acrylic polymer resin material, such as Plexiglas® V825 by Altuglas International.

Figure 8:
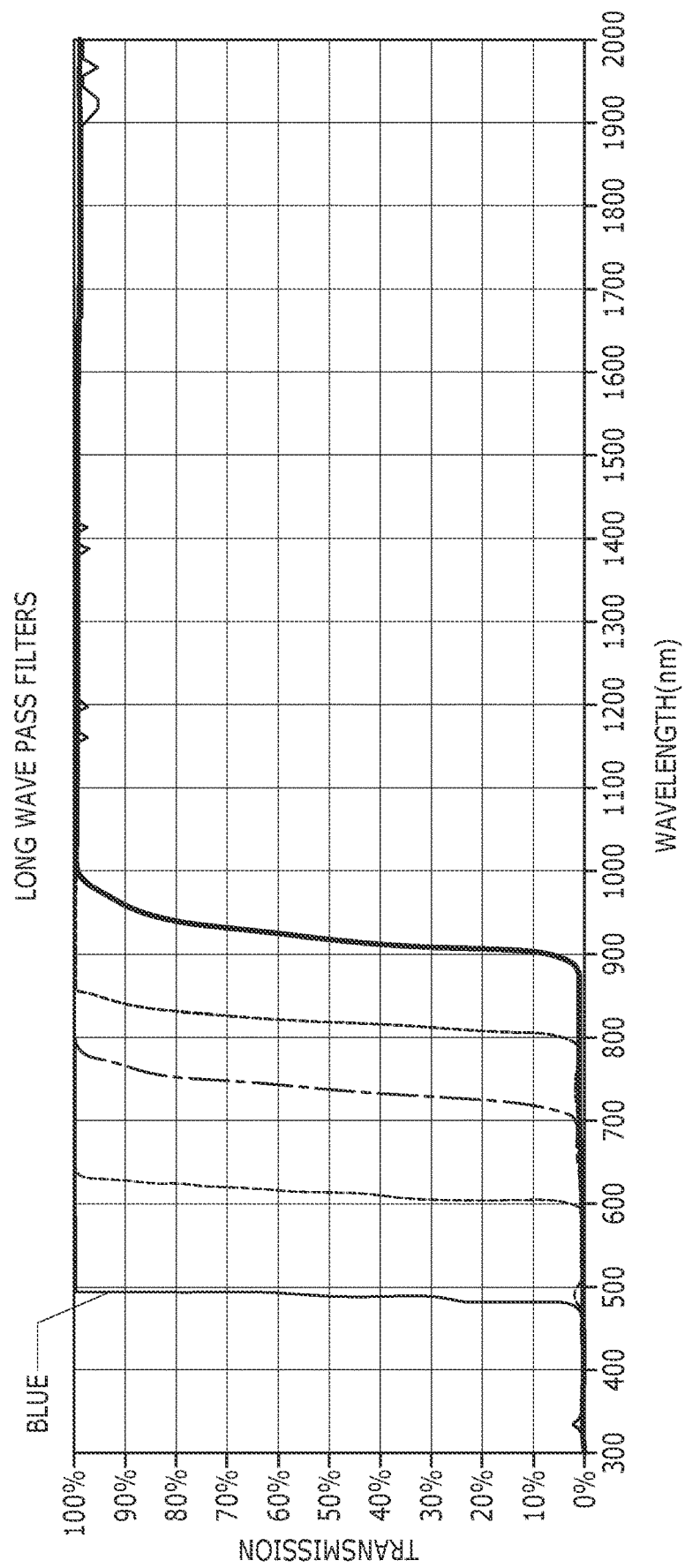
FIG. 8 is a graph showing the respective transmission curves of exemplary long pass filters for various color light waves in accordance with the present disclosure.

FIG. 8 illustrates the transmission curve for the 500 nmLP dye. More particularly, curve 810 shows the relative transmission levels for radiation that impinges on the dye. As shown, 100% of radiation having a wavelength above 500 nm is transmitted and 0% of radiation having wavelength below about 480 nm is transmitted. Radiation with wavelengths between 480 nm and 500 nm is substantially absorbed by the dye. In other words, virtually blue light, including violet and ultra-violet light, is absorbed by the dye and all green, yellow, orange and red light, including magenta and infra-red light, is permitted to pass through the dye. Also, optics in accordance with embodiments of the present invention, including embodiments of direct LED optics and embodiments where various packaging is made of the spectrally filtering resin or other material, are made from one or more different processes, including various forms of blow-molding, such as, extrusion blow molding, injection blow molding, stretch blow molding and reheat and blow molding.

In accordance with an embodiment of the disclosure, at least some of the light waves emitted from the LED and entering the optic is Stokes-shifted to a higher wavelength. That is, due to the properties of fluorescent material, the light that is absorbed in the dye, i.e., in the present example, blue light, is re-emitted at wavelengths higher than the absorbed blue light. Thus, not only is the amount of blue light ultimately emitted from the optic virtually removed, but the luminous flux, i.e., the perceived power of the light emitted from the optic, is not reduced by a value near as high as the amount of light absorbed. In other words, in addition to light having a wavelength of about 455 nm, or so, i.e., blue light, being removed from the emitted spectrum, additional light having wavelengths above 455 nm is also emitted.

Figure 9A:
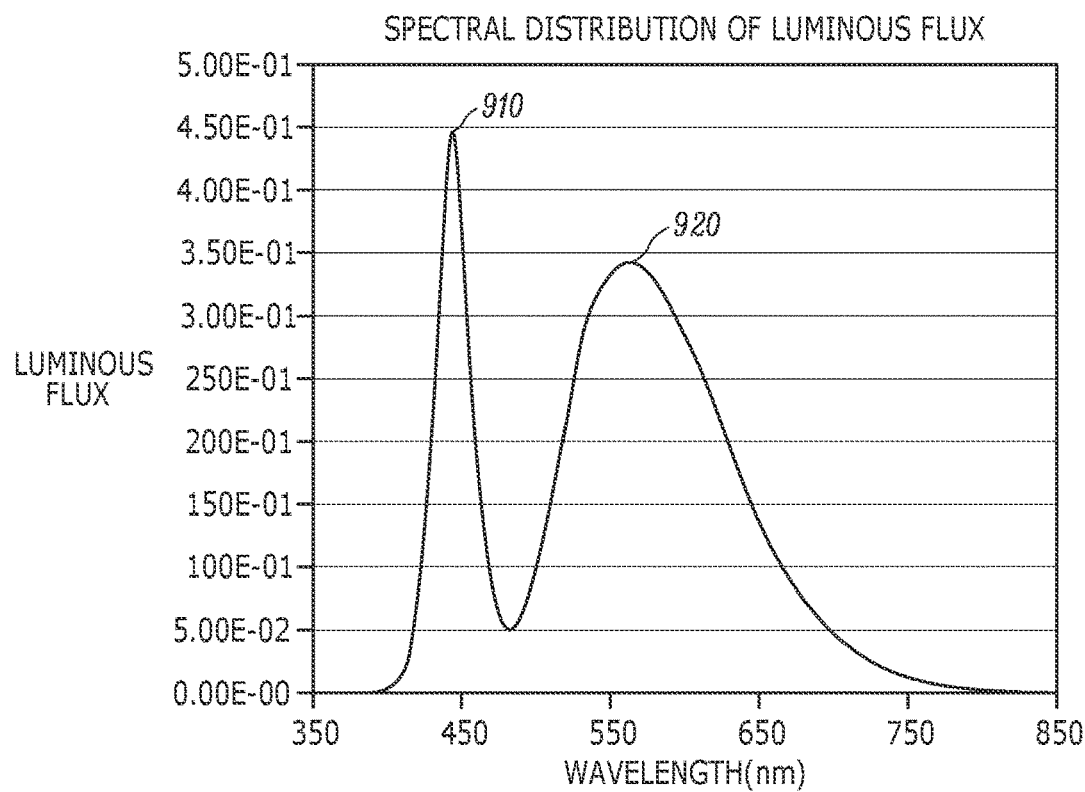
FIG. 9A is a graph showing the luminous flux output, as a function of the wavelength, of the emitted light for a luminaire with one or LEDs having respective beam-shaping TIR optics without a wavelength-shifting dye.

FIG. 9A is a graph showing the luminous flux output as a function of the wavelength of the emitted light for a luminaire in accordance with one or more embodiments of the disclosure. In this exemplary embodiment, TIR optics similar to the optic of FIGS. 2A-2D were coupled to each LED but no dye was mixed into the acrylic material used to form the TIR optic. Specifically, a flood light luminaire having 72 individual broad-spectrum white light LEDs coupled to respective optic devices was configured and various test measurements were observed. As shown in FIG. 9A, the light emitted from the luminaire has a first maxima 910 at wavelengths of about 450 nm and a second maxima 920 at about 560 nm.

Figure 9B:
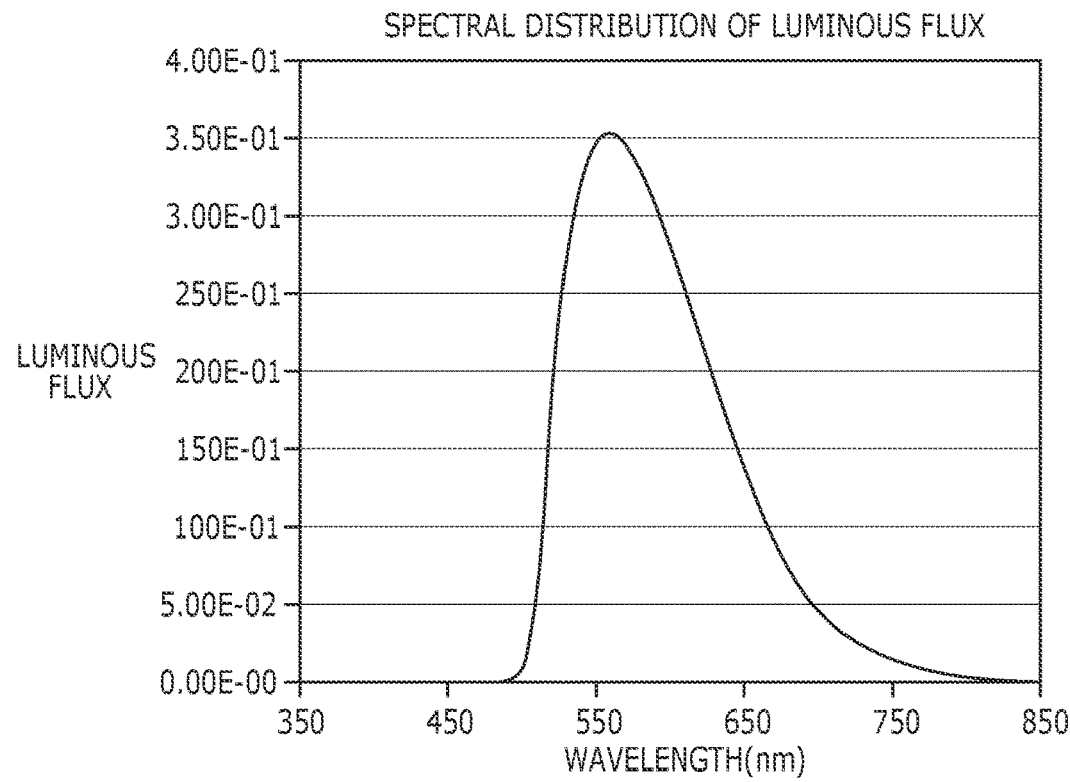
FIG. 9B is a graph showing the luminous flux output, as a function of the wavelength, of the emitted light for a luminaire with one or LEDs having respective beam-shaping TIR optics that have a wavelength-shifting dye, in accordance with one or more embodiments of the disclosure.

FIG. 9B is a graph that shows the luminous flux for the same luminaire as the one used in connection with FIG. 9A, but with one major difference. The fluorescent dye discussed above is mixed in with the acrylic material when forming the TIR optic. As shown in FIG. 9B, the spectral content of the light emitted from the luminaire is devoid of radiation wavelengths less than about 455 nm, e.g., corresponding to the first maxima 910 in FIG. 9A. Moreover, the spectrum of the emitted light has shifted towards higher wavelengths. For example, the peak wavelength in FIG. 9B is about 560 nm, i.e., which corresponds to the second maxima in FIG. 9A. However, the peak luminous flux in FIG. 9B, i.e., at 500 nm, is greater in magnitude than the value corresponding to the second maxima in 9A. This indicates that at least some of the absorbed blue light, e.g., around 455 nm, has been shifted to green light, e.g., 560 nm.

While various embodiments have been chosen to illustrate the disclosed method and device, it will be understood by those skilled in the art that other modifications may be made without departing from the scope of the disclosure as defined by the appended claims. For example, the exemplary embodiment described above for removing blue light from the spectrum of emitted light and controlling the beam shape for illuminating an outdoor object, such as a road, etc., is merely one practical application of the present disclosure. Specifically, it is contemplated that other wavelengths of radiation can be absorbed and used to shift the spectral content, and other beam shapes as defined by the configuration of the optic and are within the spirit and scope of the disclosure.

For example, it has been found that at night, artificial light disrupts the human body's biological clock, i.e., the circadian rhythm and, thus, humans exposed to inordinate amounts of light experience higher rates of sleep dysfunction. Moreover, research has shown that excess light, particularly at night, may contribute to the causation of cancer, diabetes, heart disease, and obesity. Blue light tends to be the most disruptive on the human body, especially at night.

Independent experiments have found that blue light suppressed melatonin for about twice as long as green light and shifted circadian rhythms by twice as much. Thus, various lighting applications would benefit from reducing the amount of emitted blue light and possibly shifting some of the blue light to green or red light and such applications are intended to be within the scope of this disclosure.

It should be understood that the method and device disclosed herein is not limited to any one or limited range of wavelengths of radiated beam shapes. More particularly, another application, by way of example, for the beam-shaping and spectral content controlling nature of the disclosure related to illumination of artwork. That is, all light causes irreversible damage to artworks. The extent of the deterioration depends on the type of light source, its intensity and the length of exposure the artwork is subjected to. Because light damage to artwork is accumulative, the longer the artwork is exposed, the more extensive the damage.

Natural light is an intense source of energy and contains ultra-violet (UV) radiation. Because most artworks are composed of organic materials, for example, as found in various paint, artworks are particularly vulnerable to UV wavelengths. This causes different forms of damage, including discoloration. Radiation in the visible spectrum also causes a large amount of damage and discoloration to artworks. Thus, controlling the spectral content of the emitted radiation when illuminating artworks and also controlling the beam shape to provide an efficient illumination pattern can be a useful tool for effectively displaying artwork and simultaneously protecting the artwork from undue radiation damage.

Figure 10:
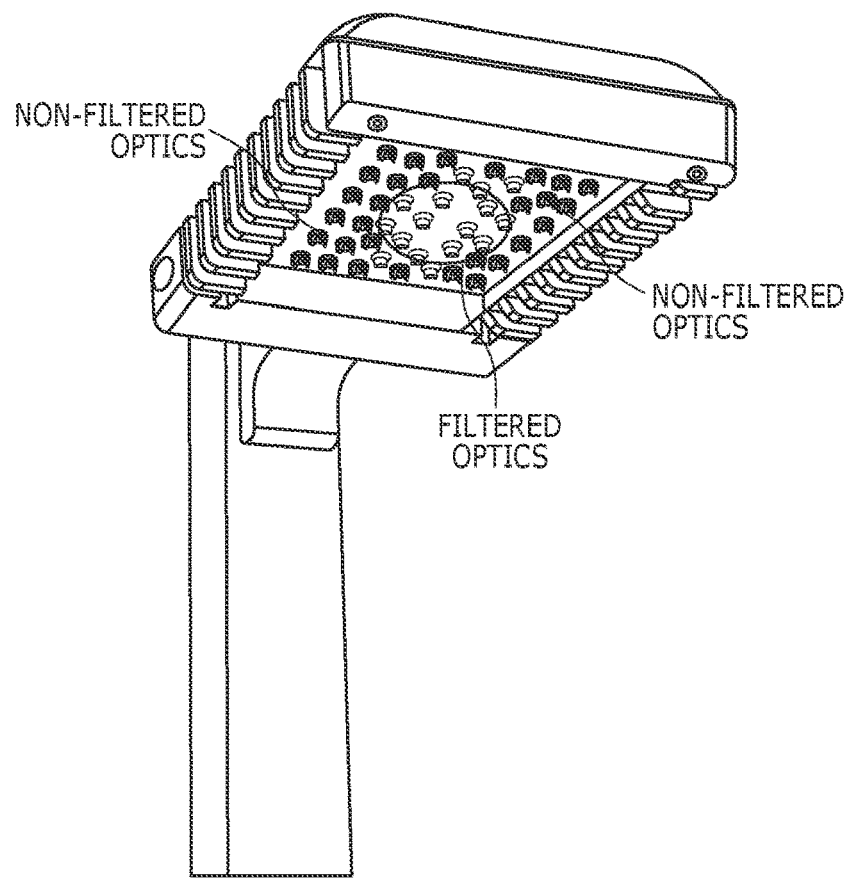
FIG. 10 is a perspective view of a single outdoor luminaire device having a plurality of both filtered and non-filters optics in accordance with one or more embodiments.
Figure 11:
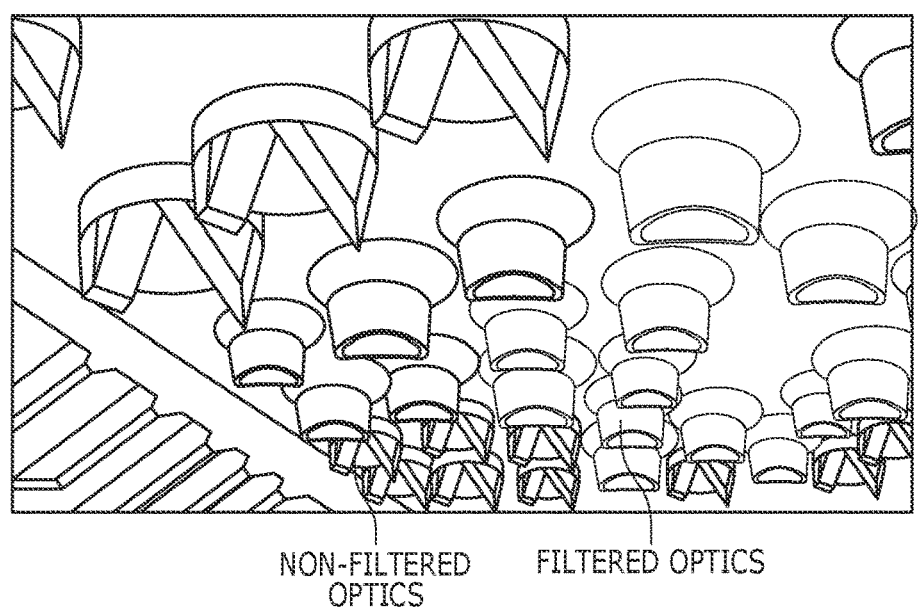
FIG. 11 is a drawing showing a close-up view of a collection of filtered and non-filtered optics in the single luminaire of FIG. 10 in accordance with one or more embodiments.

FIGS. 10 and 11 illustrate a luminaire in accordance with a further exemplary embodiment where both filtered and non-filtered optics, each corresponding to one or more LEDs, are utilized to achieve a customized lighting solution. According to this embodiment, a controller unit (not shown) is used to activate the LEDs corresponding to the filtered and non-filtered optics in a controlled manner. For example, a number of preset control values are used to alter which particular LEDs are activated at a particular time of day, thus achieving a desired lighting effect depending on the particular preset values used. An exemplary wireless controller consistent with the embodiments disclosed herein is disclosed in U.S. published patent application number 2012-0136485, the entire contents of which are incorporated herein by reference. Although the controller disclosed in this U.S. published application can be used, other controllers, either wireless or wireline, can also be used consistent with these and other embodiments.

According to one aspect of these exemplary embodiments, the wireless controls provide programmable LED lighting which reduces and filters the wavelengths in traditional light sources that emulate daylight. A luminaire with filtered and non-filtered optics according to this embodiment is programmed with presets to provide varying degrees of light "adaption" from, for example, dusk-to-dawn or customized for the particular application. Preset modes allow desired reduction of the "blue light" wavelengths of light during the night time operation of the luminaire.

FIG. 12 is a chart providing twelve (12) exemplary "presets," 1-12, listed in the left-hand column. Corresponding to each preset value are respective power, CCT, illuminance and CRI values. According to a time-of-day timer or some other pre-programmed set of controls, varying amounts of "blue light" is filtered from the overall emitted light from the luminaire. As illustrated, different control values can be used depending on whether the lighting device, e.g., luminaire, is located in an urban or mixed use setting, a low population density area, or an area such as a national park or other protected environment.

Figure 13:
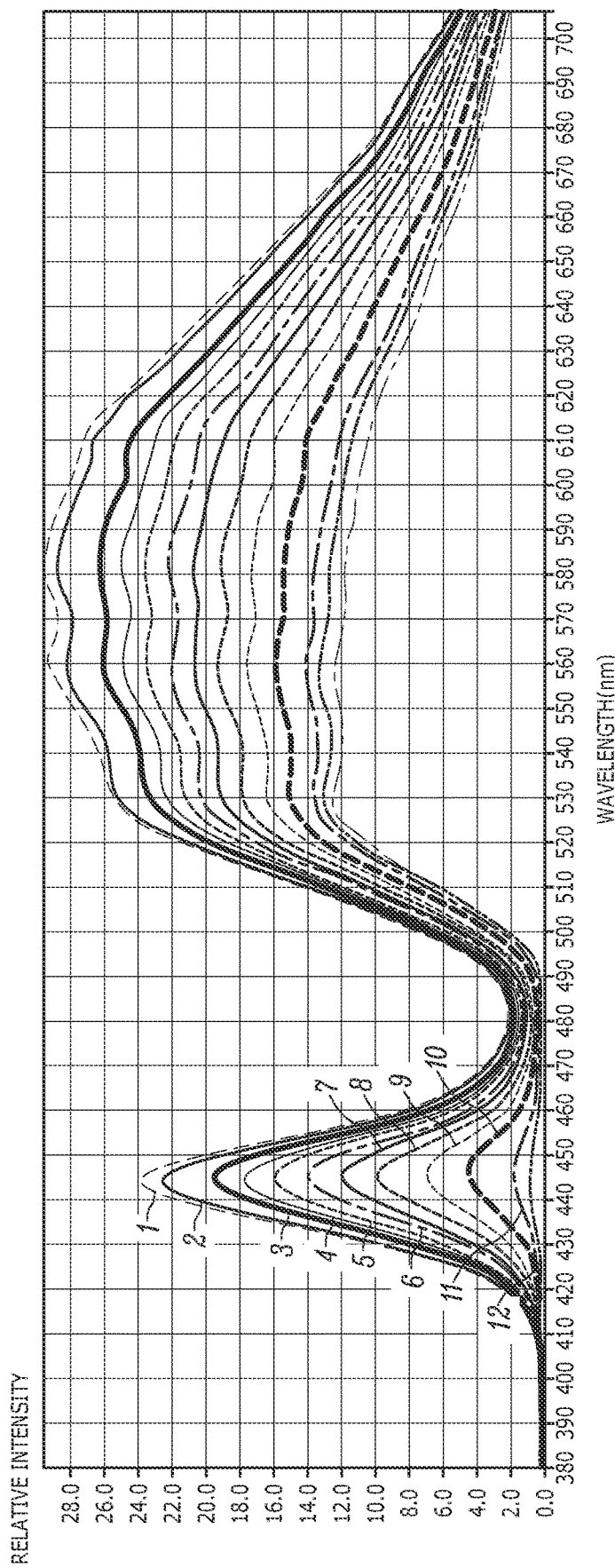
FIG. 13 is a graph showing the relative intensities of light of different wavelengths corresponding to the preset control values listed in the table of FIG. 12.

FIG. 13 shows a series of spectral distributions emitted from a given luminaire equipped with both filtered and non-filtered optics in accordance with the present embodiment. According to this embodiment the individual LEDs corresponding to the optics are controlled in accordance with the presets, 1-12, listed in the table of FIG. 12. As shown, as different combinations of LEDs corresponding to filtered and non-filtered optics are operated in accordance with the preset values, the amount of "blue light" in the wavelength band near 450 nm is altered. More particular, in the embodiment of FIG. 13 the relative intensity of the "blue light" emitted from the luminaire is reduced from about 23.0 when preset value 1 is used down to about 1.0 when the preset value 12 is used. This enables a desired spectral content to be achieved in a controllable manner using the same luminaire populated with both filtered and non-filtered optics.

Figure 14:
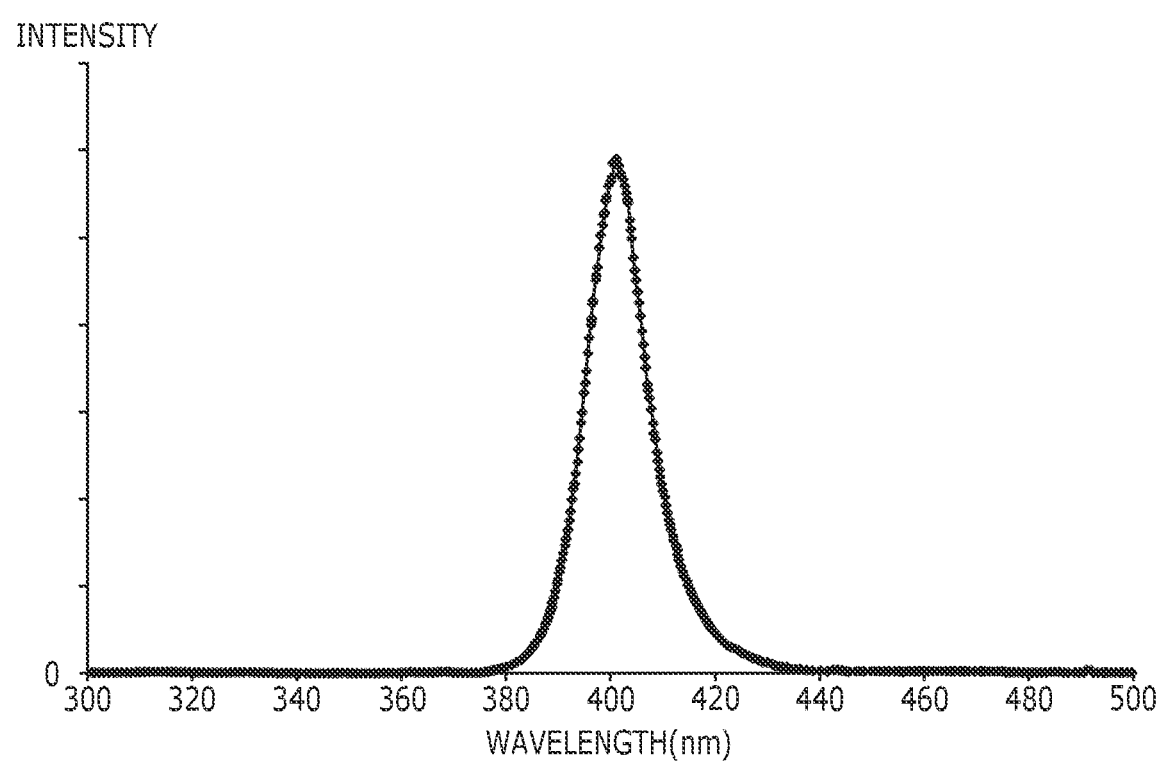
FIG. 14 is a graph showing examples of relative intensities of light of different wavelengths corresponding to a high-intensity narrow-spectrum (HINS) light output.

According to another exemplary embodiment, beam shaping and/or wavelength shifting is utilized with a high-intensity narrow-spectrum (HINS) light output. One example of HINS light output is around approximately 380-440 nanometers. In certain embodiments the light output can be between 400-420 nanometers, and in certain embodiments the light output can be focused around an output of 405 nanometers. FIG. 14 shows the light output of an exemplary LED outputting light focused in this range, which may be used to potentially reduce or help suppress bacterial pathogens in environments, such as, but not limited to, hospitals, food preparation and storage, areas of mass congregation and the like. In an exemplary embodiment the light is configured to produce an output with a peak around approximately 405 nanometers. Light in this wavelength produces violet light that may be capable of generating reactive oxygen species (ROS) such as hydrogen peroxide, oxygen singlets, and OH groups in certain microbes. Similar to previous embodiments shown or described herein, light in the approximately 380-440 or 380-420 nanometer band can be combined with additional light sources to create lights that have a more traditional light output combined with the potential microbial and bacterial suppressing properties of the HINS lights, and the light can be shifted and controlled as discussed above.

What is claimed is:

1. A lighting device comprising:
   a housing;
   a first LED light source positioned in the housing, the first LED light source emitting light having a first bandwidth;
   a filter coupled to the light source, wherein the filter has a preselected subrange of wavelengths within the first bandwidth to generate a first filtered light; and
   a second LED light source positioned in the housing, the second LED light source emitting a high-intensity narrow-spectrum focused light output,
      wherein the first filtered light is a high-intensity narrow-spectrum light output, and
      wherein the second light source is configured for medical sterilization.

2. The lighting device recited in claim 1, wherein filter is a free-form optic made of a material into which a filtering agent is disposed and the filtering agent filters the light having a preselected subrange of wavelengths.

3. The lighting device recited in claim 1, wherein the high-intensity narrow-spectrum light output is between approximately 380-440 nanometers.

4. The lighting device recited in claim 3, wherein the high-intensity narrow-spectrum light output is between approximately 400-420 nanometers.

5. The lighting device recited in claim 1, wherein the high-intensity narrow-spectrum light output has a peak output of approximately 405 nanometers.

6. The lighting device recited in claim 1, wherein the filter shifts light from within the first bandwidth to within a second bandwidth not included in the first bandwidth.

7. The lighting device recited in claim 1, wherein the filter includes a free-form optic made of a material into which a filtering agent is disposed and the filtering agent filters the light having a preselected subrange of wavelengths.

8. A method of making a lighting device comprising:
   coupling a filtering optic device to at least one LED that emits light waves in a first range of wavelengths, wherein the filtering agent filters light having a preselected subrange of wavelengths within the first range of wavelengths to generate, as a high-intensity narrow-spectrum light output, a first filtered light,
      wherein the filtering optic device controls a shape of a beam of the filtered light, and wherein the filtering optic device includes a filtering agent combined with an optical material; and
   combining the filtered light with a high-intensity narrow-spectrum focused light output to provide sterilization.

9. The method recited in claim 8, wherein the filtering optic device is a TIR optic.

10. The method recited in claim 8, wherein the filtering optic is only coupled to the LED.

11. The methods of claim 8, wherein the high-intensity narrow-spectrum light output is in the range of approximately 380 to approximately 440 nanometers.

12. The methods of claim 11, wherein the high-intensity narrow-spectrum light output is in the range of approximately 400 to approximately 420 nanometers.

13. The method recited in claim 8, further comprising combining the filtering optic device with a non-filtering optic device within a luminaire device, wherein the non-filtering optic device does not include the filtering agent.

14. The method recited in claim 8, wherein the filtering agent includes one or more of a dye, phosphors, fluorescing material and quantum dots.

15. A lighting device comprising:
 a housing;
 a first LED light source positioned in the housing, the first LED light source emitting light having a first bandwidth;
 a second LED light source positioned in the housing, the second LED light source emitting light having a high-intensity narrow-spectrum focused light output, wherein the second LED light source is configured for medical sterilization;
 a first optic device coupled to the first LED light source, wherein the first optic device filters light having a preselected subrange of wavelengths within the first bandwidth and generates a first filtered light;
 a second optic device coupled to the second LED light source, wherein the second optic device permits the second bandwidth of light to pass through it unfiltered; and
 a control device operably connected to the first and second LED light sources and operable to control whether light is emitted from one, both or neither of the first and second LED light sources based on preset control values,
 wherein the first filtered light is a high-intensity narrow-spectrum light output.

16. The lighting device recited in claim 15, wherein the control device is a wireless control device operable to control each of the first and second light sources via wireless control signals.

17. The lighting device recited in claim 15, wherein the high-intensity narrow-spectrum light output corresponds to a range of wavelengths that can reduce or suppress bacterial pathogens.

18. The lighting device recited in claim 15, wherein the high-intensity narrow-spectrum light output is between approximately 380-440 nanometers.

19. The lighting device recited in claim 18, wherein the high-intensity narrow-spectrum light output is between approximately 400-420 nanometers.

20. The lighting device recited in claim 15, wherein the high-intensity narrow-spectrum light output has a peak output of approximately 405 nanometers.

* * * * *